United States Patent
Ohno et al.

(10) Patent No.: US 9,070,457 B2
(45) Date of Patent: Jun. 30, 2015

(54) MAGNETIC TUNNEL JUNCTIONS WITH PERPENDICULAR MAGNETIZATION AND MAGNETIC RANDOM ACCESS MEMORY

(75) Inventors: Hideo Ohno, Sendai (JP); Shoji Ikeda, Sendai (JP); Michihiko Yamanouchi, Sendai (JP); Hideo Sato, Sendai (JP); Katsuya Miura, Higashimurayama (JP)

(73) Assignee: Tohoku University, Sendai-shi, Miyagi (JP)

( * ) Notice: Subject to any disclaimer, the term of this patent is extended or adjusted under 35 U.S.C. 154(b) by 507 days.

(21) Appl. No.: 13/480,303

(22) Filed: May 24, 2012

(65) Prior Publication Data

US 2012/0300543 A1 Nov. 29, 2012

(30) Foreign Application Priority Data

May 27, 2011 (JP) .................................. 2011-119409

(51) Int. Cl.
| | | |
|---|---|---|
| *G11C 11/00* | (2006.01) | |
| *G11C 11/16* | (2006.01) | |
| *H01L 43/08* | (2006.01) | |
| *H01F 10/32* | (2006.01) | |
| *H01L 27/22* | (2006.01) | |

(52) U.S. Cl.
CPC ........... *G11C 11/16* (2013.01); *Y10T 428/1114* (2015.01); *H01L 43/08* (2013.01); *H01L 27/228* (2013.01); *H01F 10/3254* (2013.01); *H01F 10/3286* (2013.01)

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, E21.665; 438/3; 977/933–935
See application file for complete search history.

(56) References Cited

U.S. PATENT DOCUMENTS

| | | | | |
|---|---|---|---|---|
| 8,159,872 B2* | 4/2012 | Fukami et al. | ................. | 365/173 |
| 8,169,818 B2* | 5/2012 | Ohmori et al. | ................. | 365/158 |
| 8,411,499 B2* | 4/2013 | Ohmori et al. | ................. | 365/171 |
| 8,750,028 B2* | 6/2014 | Ogimoto | ....................... | 365/158 |
| 2003/0067800 A1 | 4/2003 | Koganei | | |
| 2007/0086121 A1 | 4/2007 | Nagase et al. | | |

(Continued)

FOREIGN PATENT DOCUMENTS

| | | |
|---|---|---|
| JP | 2003-110162 A | 4/2003 |
| JP | 2007-142364 A | 6/2007 |

(Continued)

OTHER PUBLICATIONS

Office Action issued Apr. 23, 2013, in Japanese Patent Application No. 2011-119409.

(Continued)

*Primary Examiner* — Harry W Byrne
(74) *Attorney, Agent, or Firm* — Miles & Stockbridge P.C.

(57) ABSTRACT

In magnetic tunnel junctions manufactured with use of a ferromagnetic material having perpendicular magnetic anisotropy, a difference in record retention time depending on stored information due to an imbalance in thermal stability between a parallel state and an anti-parallel state of magnetization, which correspond to bit information, is alleviated. A reference layer and a recording layer which constitute a magnetic tunnel junction are made different in area from each other so as to correct the difference in record retention time corresponding to stored information.

12 Claims, 14 Drawing Sheets

(56) References Cited

U.S. PATENT DOCUMENTS

| | | | |
|---|---|---|---|
| 2008/0043519 A1 | 2/2008 | Kitagawa et al. | |
| 2008/0088980 A1 | 4/2008 | Kitagawa et al. | |
| 2010/0309713 A1* | 12/2010 | Fukami et al. | 365/158 |
| 2011/0026322 A1* | 2/2011 | Ohmori et al. | 365/171 |
| 2011/0032744 A1* | 2/2011 | Ohmori et al. | 365/145 |
| 2012/0134201 A1* | 5/2012 | Ogimoto | 365/158 |

FOREIGN PATENT DOCUMENTS

| | | |
|---|---|---|
| JP | 2008-098523 A | 4/2008 |
| JP | 2009-093787 A | 4/2009 |
| JP | 2010-245415 A | 10/2010 |
| WO | WO 2011/008614 A1 | 1/2011 |

OTHER PUBLICATIONS

Slonczewski "Current-driven excitation of magnetic multilayers", journal of Magnetism and Magnetic Materials 159 (1996) L1-L7.

S. Ikeda et al., "Tunnel magnetoresistance of 604% at 300 K by suppression of Ta diffusion in CoFeB/MgO/CoFeB pseudo-spin-valves annealed at high temperature", Applied Physics Letters 93, 082508 (2008) pp. 1-3.

S. Ikeda et al. "A perpendicular-anisotropy CoFeB—MgO magnetic tunnel junction", Nature Materials, vol. 9, Sep. 2010, pp. 721-724.

\* cited by examiner

P state

AP state

MAGNETIC TUNNEL JUNCTIONS WITH PERPENDICULAR MAGNETIZATION AND MAGNETIC RANDOM ACCESS MEMORY

CLAIM OF PRIORITY

The present application claims priority from Japanese patent application JP 2011-119409 filed on May 27, 2011, the content of which is hereby incorporated by reference into this application.

BACKGROUND OF THE INVENTION

1. Field of the Invention

The present invention relates to magnetic tunnel junctions and a magnetic random access memory (MRAM) having the magnetic tunnel junctions as memory cells.

2. Background Art

The MRAM is a nonvolatile memory promising as a potential universal memory in terms of high integration, high-speed operation and so forth. As shown in FIG. 1, an MRAM memory cell 100 is configured to have a magnetic tunnel junction 101, such as GMR (Giant magnetoresistance) elements and TMR (Tunnel magnetoresistance) elements, and a selecting transistor 102, which are electrically connected to each other in series. The selecting transistor 102 has a source electrode, a drain electrode and a gate electrode, which are electrically connected to a source line 103, to a bit line 104 via the magnetic tunnel junction 101, and to a word line 105, respectively. The magnetic tunnel junction 101 has a three-layer configuration as a basic configuration, in which a nonmagnetic layer 108 is interposed between two ferromagnetic layers, a first ferromagnetic layer 106 and a second ferromagnetic layer 107. In an example shown in a drawing, the first ferromagnetic layer 106 is a reference layer whose magnetization direction is invariable, whereas the second ferromagnetic layer 107 is a recording layer whose magnetizing direction is variable. The magnetic tunnel junction 101 has low resistance when the magnetization directions of the reference layer and the recording layer are parallel (P state) to each other and has high resistance when they are anti-parallel (AP state) to each other. As shown in Appl. Phys. Lett., 93, 082508 (2008), a resistance variation rate exceeds 600% at room temperature in the case of TMR elements having the nonmagnetic layer 108 made of MgO. Such a large resistance variation rate is known to be seen in the case where coherent tunnel transport via a $\Delta_1$ band is used, the tunnel transport being implemented when a ferromagnetic material, including at least one of 3d transition metal elements such as Co and Fe, is applied to the first ferromagnetic layer 106 and to the second ferromagnetic layer 107 and MgO is applied to the nonmagnetic layer 108.

Magnetic tunnel junctions, such as TMR elements, are nonvolatile since information is stored by using the magnetic configuration. The magnetic tunnel junctions are expected not only to be used for the MRAM but also to be applied as memory elements distributed to logic circuits. When the magnetic tunnel junctions are used as memory elements of the MRAM and the like, the resistance variation of the magnetic tunnel junction is made to correspond to "0" and "1" bit information. As a method for writing bit information, a magnetization reversal method by spin-transfer torque has been proposed as shown in J. Magn. Mater., 159, L1-L7 (1996). This method uses a phenomenon of magnetization direction switching induced by spin-transfer torque which is generated by passing current through the magnetic tunnel junction. When current is passed from a reference layer to a recording layer, the magnetization directions of the reference layer and the recording layer become anti-parallel to each other, and thereby bit information is set to 1. When current is passed from the recording layer to the reference layer, the magnetization directions of the reference layer and the recording layer become parallel, and thereby bit information is set to "0."

In order to implement an MRAM, there are some requirements which should be satisfied simultaneously by the magnetic tunnel junction 101 that is a recording element. Main requirements include (1) high magnetoresistance variation rate (MR ratio), (2) low switching current, and (3) high thermal stability factor. Specific performance requirements which should be satisfied vary depending on application parameters such as an integration density, a minimum, processing size, and working speed. For example, as for the performance requirement (1), the MR ratio needs to be higher as readout speed is increased. This performance requirement also varies depending on the application of the TMR element, i.e., depending on whether the TMR element is used as a memory element compositely mounted with logic circuits or the TMR element is used as a memory element of a single memory device. Generally, the MR ratio is as high as 50% to 100% or more. As for the performance requirement (2), the switching current needs to be lower than the current that can be supplied by the selecting transistor. The smaller selecting transistor 102 provides lower drive current. Therefore, when the selecting transistor 102 becomes smaller, the required switching current needs to be equal to or lower than the drive current on a constant basis. Further, the condition (3) relates to record retention time of the magnetic tunnel junction 101 and to write disturb therein. For ensuring ten years or more record retention time and preventing write disturb, a 1-bit TMR element needs a thermal stability factor of 40 or more. As the MRAM has a larger capacity, a required thermal stability factor is increased. In order to implement a Gbit-class MRAM, the thermal stability factor needs to be 70 to 80 or more.

In order to meet these requirements, inventors of the present invention prepared a component for use at least in either one of the first ferromagnetic layer 106 and the second ferromagnetic layer 107, which constitute the magnetic tunnel junction 101 of FIG. 1, from a material including at least one kind of 3d transition metals, such as Co and Fe. When magnetic tunnel junctions are manufactured with a material which includes at least one kind of 3d transition metals such as Co and Fe and which is crystallized into a bcc structure by thermal treatment, the magnetization direction of the ferromagnetic layers is generally parallel to a film plane. However, as shown in Nature Mater., 9, 721 (2010), the inventors of the present invention have developed a technology to control the film thickness of the ferromagnetic layers within 3 nm or less and to orient the magnetization direction perpendicular to the film plane. The magnetization direction perpendicular to the film plane is presumed to be provided by interface magnetic anisotropy which is induced at the interface between MgO used as a material of the nomnagnetic layer 108 and a material of the ferromagnetic layer including at least one kind of 3d transition metals such as Co and Fe. By using the interface magnetic anisotropy effectively, the perpendicular magnetic anisotropy is induced. With use of this technology, the aforementioned MR ratio of 100% or higher, the switching current lower than the drive current of the selecting transistor 102, and the thermal stability factor of 40 or more are implemented.

SUMMARY OF THE INVENTION

FIG. 2A and FIG. 2B schematically show a P state and an AP state of the magnetic tunnel junction 101 whose magnetization direction is perpendicular to the film plane. The P state (bit information of "0") shown in FIG. 2A is stabilized due to dipole coupling acting on between magnetization of two ferromagnetic layers. This is because the magnetic poles different in polarity are close to each other and attraction force acts therebetween. On the contrary, the AP state (bit information of "1") shown in FIG. 2B is unstable. This is because the magnetic poles with the same polarity are close to each other and repulsive force acts therebetween. Thus, in the magnetic tunnel junction having magnetization perpendicular to the film plane as compared with the magnetic tunnel junction having magnetization parallel to the film plane, the reference layer and the recording layer are close to each other so that strong dipole coupling is provided. As a result, a considerable difference in stability is generated between the P state and the AP state. FIG. 2B shows an example in which the north poles are close to each other.

FIG. 3A schematically shows an energy state of the magnetic tunnel junction 101 without dipole coupling as an example. An energy barrier exists between the P state and the AP state. Transition between the P state and the AP state is achieved by applying a current and a magnetic field to overcome the energy barrier. Without dipole coupling, an energy barrier $E_P$ which should be overcome for transition from the P state to the AP state is equal in height to an energy barrier $E_{AP}$ which should be overcome for transition from the AP state to the P state. The intrinsic energy barrier in this state is defined as $E_0$ ($E_0 = E_P = E_{AP}$ in this condition). FIG. 3B schematically shows an energy state of the magnetic tunnel junction 101 with dipole coupling. In this case, the P state is stable, so that potential energy is low. On the contrary, the AP state is unstable, so that potential energy is high. As a result, the energy barrier $E_P$ which should be overcome for transition from the P state to the AP state is different from the energy barrier $E_{AP}$ which should be overcome for transition from the AP state to the P state ($E_P > E_0 > E_{AP}$ in this condition). Transition from the AP state to the P state is easily made, whereas transition from the P state to the AP state needs higher energy. This indicates that the bit information "1" and "1" corresponding to the P state and the AP state are different in retention time from each other. In short, when the bit information of the magnetic tunnel junction is "0" (P state), the retention time is long, whereas when the bit information is "1" (AP state), the retention time is short. This tendency is particularly notable in the case of the magnetic tunnel junction having magnetization perpendicular to the film plane as described before.

A thermal stability factor $E_P/k_B T$ in the P state and a thermal stability factor $E_{AP}/k_B T$ in the AP state, which are dependent on the magnitude of dipole coupling, are expressed in the following formulas:

$$E_P/k_B T = E_0(1+H_s/H_k^{rec})^2/k_B T \qquad (1)$$

$$E_{AP}/k_B T = E_0(1-H_s/H_k^{rec})^2/k_B T \qquad (2)$$

where $H_s$ represents a magnitude of a magnetic field generated from the reference layer, i.e., a magnitude of dipole coupling, $H_k^{rec}$ represents an anisotropy magnetic field of the recording layer, $k_B$ represents a Boltzmann's constant, and T represents absolute temperature.

FIG. 4A shows a minor loop of resistance-magnetic field characteristics (R-H characteristics) of the magnetic tunnel junction without dipole coupling (corresponding to FIG. 3A). In this case, the center of the minor loop corresponds to $\mu_0 H = 0$, where $\mu_0$ is magnetic permeability under vacuum. FIG. 4B shows a minor loop of R-H characteristics of the magnetic tunnel junction with dipole coupling (corresponding to FIG. 3B), where the center of the minor loop is shifted from $\mu_0 H = 0$. The center of the minor loop corresponds to $H_s$.

There is also a relation between dipole coupling and the magnitude of the switching current. As mentioned above, in write operation of the magnetic tunnel junction, bit information "1" is written when current is passed from the reference layer to the recording layer, while bit information "0" is written when current is passed from the recording layer to the reference layer. In the magnetic tunnel junction, the magnitude of current theoretically differs corresponding to written bit information as shown in the following formulas:

$$J_{c0} = \alpha \gamma e M_s H_k^{rec} t_{rec}/\mu_B g(\theta) \qquad (3)$$

$$J_c = J_{c0}[1 - k_B T/E \ln(\tau_p/\tau_0)] \qquad (4)$$

where $J_c$ represents a switching current, $J_{c0}$ represents a switching current when write time is 1 nanosecond, $\alpha$ represents a damping constant, $\gamma$ represents a gyromagnetic constant, e represents an elementary charge. $M_s$ represents saturated magnetization of the recording layer, $t_{rec}$ represents a film thickness of the recording layer, $\tau_p$ represents write time, and $\tau_0$ represents trial time of 1 nanosecond.

Moreover, $g(\theta)$ represents an efficiency of spin transfer torque, which is expressed in the following formula:

$$g(\theta) = p/[2(1+p^2 \cos \theta)] \qquad (5)$$

where p represents spin polarization and $\theta$ represents a relative angle between the magnetization direction of the reference layer and the magnetization direction of the recording layer. In the P state, $\theta = 0$, whereas in the AP state, $\theta = \pi$. Therefore, the switching current for writing bit information 1 is larger than the switching current for writing bit information "0". At the time of p=0.6, the former is about mice as large as the latter. When $H_s$ is taken into consideration, the switching current $J_{c0}^P$ for transition from the P state to the AP state and the switching current $J_{c0}^{AP}$ for transition from the AP state to the P state are expressed by the following formulas:

$$J_{c0}^P = \alpha \gamma e M_s(H_k^{rec} + H_s)t/\mu_B g(0) \qquad (6)$$

$$J_{c0}^{AP} = \alpha \gamma e M_s(H_k^{rec} - H_s)t/\mu_B g(\pi) \qquad (7)$$

This indicates a still larger difference between the switching current for bit information "0" and the switching current for bit information "1".

In order to solve these problems and to implement MRAM and nonvolatile logic circuits, it is necessary to eliminate or reduce dipole coupling. An object of the present invention is to provide a configuration to reduce dipole coupling and to implement stable operation of magnetic tunnel junctions.

In order to accomplish the above object, we focus on the area of the first ferromagnetic layer and the second ferromagnetic layer which constituted a magnetic tunnel junction. Hereinafter, means for solving the problems will be described by taking as an example the case where the magnetic tunnel junction has a circular shape, the first ferromagnetic layer is the reference layer and the second ferromagnetic layer is the recording layer. In the magnetic tunnel junction, $H_s$ is generated from the reference layer by dipole coupling and is applied onto the recording layer. The magnitude of $H_s$ depends on M of the reference layer, a diameter $d_{ref}$ of the reference layer, and a film thickness $t_{ref}$ of the reference layer. $H_s$ distributed over a central portion, of the recording layer is expressed by the following formula:

$$H_s = M_s t_{ref}(d_{ref}/2)^2/2\mu_0[\{(d_{ref}/2)^2 + t_{bar}^2\}^{3/2}] \qquad (8)$$

Therefore, if $d_{ref}$ is large, $H_s$ is expected to be small. In this case, $t_{bar}$ is a film thickness of a harrier layer.

FIG. 5A shows a general magnetic tunnel junction 101 in which the reference layer 106 and the recording layer 107 have the same area. Arrows shown in the drawing are magnetic lines of force, which schematically express application of $H_s$ to the recording layer. FIG. 5B shows a magnetic tunnel junction 101 in which the area of the reference layer is designed larger than the area of the recording layer. Because the magnetic tunnel junction in FIG. 5B has the reference layer with a larger area than the magnetic tunnel junction shown in FIG. 5A, the magnetic lines of force spreading to the outside are schematically expressed. As a result of actual calculation of a relation between $d_{ref}$ and $H_s$ by the formula (8), it is found out that increasing the area of the reference layer as shown in FIG. 5B makes it possible to decrease $H_s$. FIG. 6 shows the calculated relation between $d_{ref}$ and $H_s$.

If smaller $H_s$ is obtained by increasing $d_{ref}$ as shown in FIG. 6, it becomes possible to suppress reduction of $E_{AP}$, which has been a problem of the magnetic tunnel junction having magnetization perpendicular to the film plane. Further, an imbalance between $J_{c0}^P$ and $J_{c0}^{AP}$ is also decreased. Here, a required value of $d_{ref}$ which is appropriate for suppressing the reduction of $E_{AP}$ is estimated. When the magnitude of $H_k^{rec}$ is assumed to be 340 mT with reference to Nature Mater., 9, 721 (2010) for example, the value of $d_{ref}$ needs to be 90 nm or more for suppressing the reduction amount of $E_{AP}/k_BT$ by $H_s$ to about 10%. A hatched region in FIG. 6 shows a region where the reduction amount of $E_{AP}/k_BT$ can be lowered to 10% or less when $H_k^{rec}$ is assumed to be 340 mT. At $d_{ref}=90$ nm, $\mu_0 H_s$ corresponds approximately to 17 mT. Both changes of $J_{c0}^P$ and $J_{c0}^{AP}$ can be suppressed to 6% or less.

Even when the magnitude of $H_k^{rec}$ is not 340 mT, it becomes possible to derive a design value of $d_{ref}$ according to the value of $H_k^{rec}$ of the recording layer by using the formula (8). FIG. 7 shows a relation between $H_k^{rec}$ of the recording layer and $d_{ref}$ of the reference layer under the condition that the reduction amount of $E_{AP}/k_BT$ by $H_s$ is to be 10% or less. As $H_k^{rec}$ of the recording layer increases, the design value of $d_{ref}$ can be made smaller as shown in the drawing. Even when a set value of $E_{AP}/k_BT$ reduction amount by $H_s$ is not 10%, a relation between $H_k^{rec}$ and $d_{ref}$ similar to that in FIG. 7 can be estimated by setting the set value of $E_{AP}/k_BT$ reduction amount in an allowable range according to purpose. Thus, if the characteristics of parameters such as $H_k^{rec}$ of the recording layer can be obtained, it becomes possible to derive the design value of $d_{ref}$.

A diameter $d_{rec}$ of the recording layer is obtained by determining a volume V of the recording layer based on the required $E/k_BT$ with use of the value of $H_k^{rec}$ of the recording layer. The value of $E/k_BT$ of the recording layer needs to be large enough to record and retain bit information, and the value of $H_k^{rec}$ is required to correspond to that $E/k_BT$ value. For example, as disclosed in Nature Mater., 9, 721 (2010), when CoFeB is applied to the first ferromagnetic layer 106 and to the second ferromagnetic layer 107 and MgO is applied to the nonmagnetic layer 108, the value of $H_k^{rec}$ increases as the film thickness decreases. If this technology is used, controlling the film thickness makes it possible to obtain the value of $H_k^{rec}$ required for recording and retention. Once the value of $H_k^{rec}$ is determined, the diameter $d_{rec}$ of the recording layer should be determined such that sufficiently large $E/k_BT$ can be obtained by using $H_k^{rec}$ and $M_s$. The thermal stability factor $E/k_BT$ of the recording layer should be designed to be at least 40 or more and preferably 70 to 80 or more. Moreover, $E/k_BT$ of the reference layer may erroneously be written to the reference layer at the time of writing to the recording layer. The value of $E/k_BT$ needs to be large enough to prevent such write disturb. Also in this case, when CoFeB is applied to the first ferromagnetic layer 106 and to the second ferromagnetic layer 107 and MgO is applied to the nonmagnetic layer 108, controlling the film thickness makes it possible to obtain a required anisotropy magnetic field $H_k^{ref}$ of the reference layer and to secure a value $E/k_BT$ of the reference layer required for suppressing the write disturb.

According to the present invention, $H_s$ can be made smaller. As a result, it becomes possible to decrease a difference in thermal stability between the P state and the AP state, which is a problem of the magnetic tunnel junctions with perpendicular magnetization. It also becomes possible to decrease a difference between a P to AP switching current and an AP to P switching current. As for a designable size of $d_{ref}$, an allowable range of the reduction amount of $E/k_BT$ (the reduction amount is set to 10% or less in the above-mentioned description) is set, and then the value of $d_{ref}$ can be derived according to the value of $H_k^{rec}$ of the recording layer.

Objects, configurations and effects other than those in the foregoing description will become apparent in the following description of the embodiments.

DETAILED DESCRIPTION OF THE PREFERRED EMBODIMENTS

Hereinafter, magnetic tunnel junctions and an MRAM with the present invention applied thereto will be described in detail with reference to the drawings.

Embodiment 1

In one aspect of the present invention, a difference in thermal stability between the P state and the AP state of the magnetic tunnel junction can be decreased by making a reference layer larger in area than a recording layer in the magnetic tunnel junction. It also becomes possible to decrease a difference between a P to AP switching current and an AP to P switching current.

Figure 1:
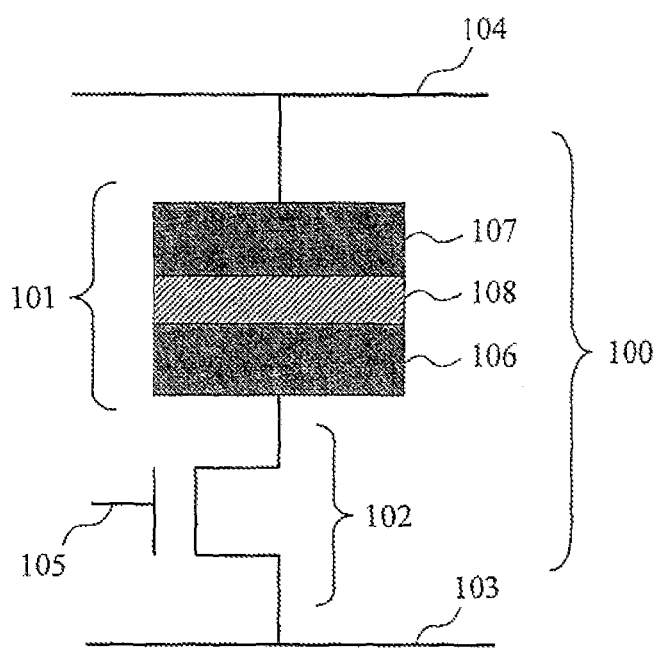
FIG. 1 is a schematic cross sectional view of an MRAM memory cell and a magnetic tunnel junction.
Figure 2A:
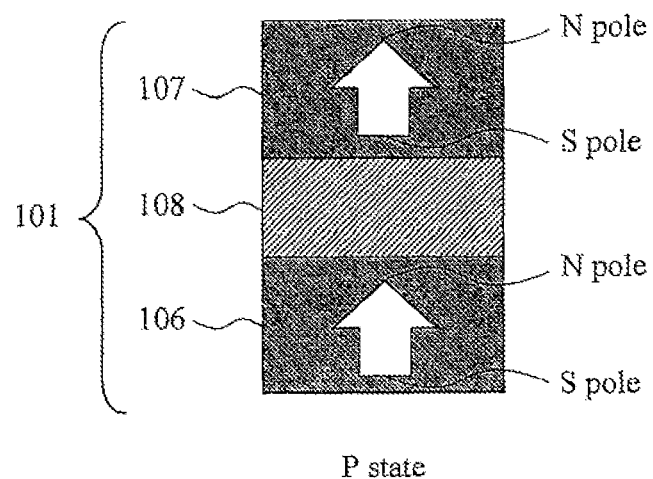
FIG. 2A is a view showing magnetization configuration of a magnetic tunnel junction with perpendicular magnetization in the P state.
Figure 2B:
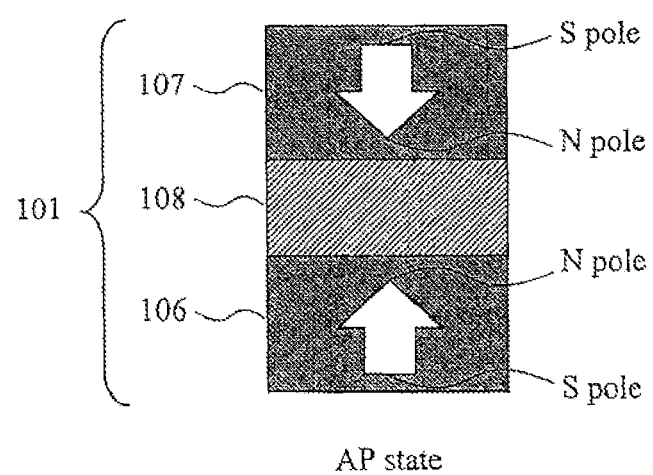
FIG. 2B is a view showing magnetization configuration of the magnetic tunnel junction with perpendicular magnetization in the AP state.
Figure 3A:
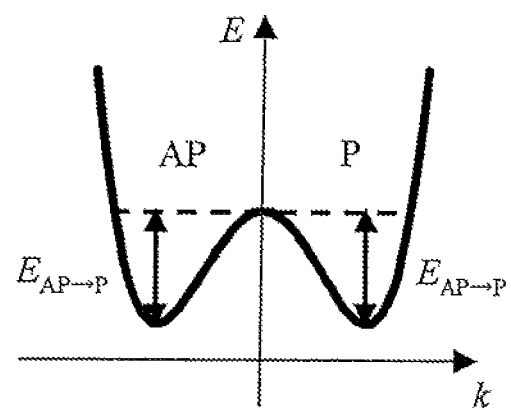
FIG. 3A is a schematic view showing an energy state of the magnetic tunnel junction with perpendicular magnetization without $H_s$.
Figure 3B:
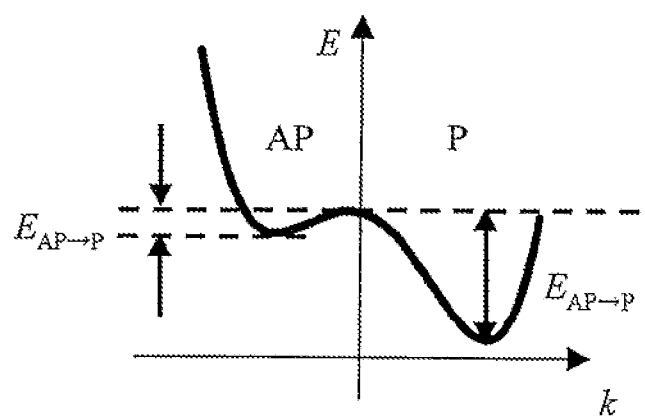
FIG. 3B is a schematic view showing an energy state of the magnetic tunnel junction with perpendicular magnetization with $H_s$.
Figure 4A:
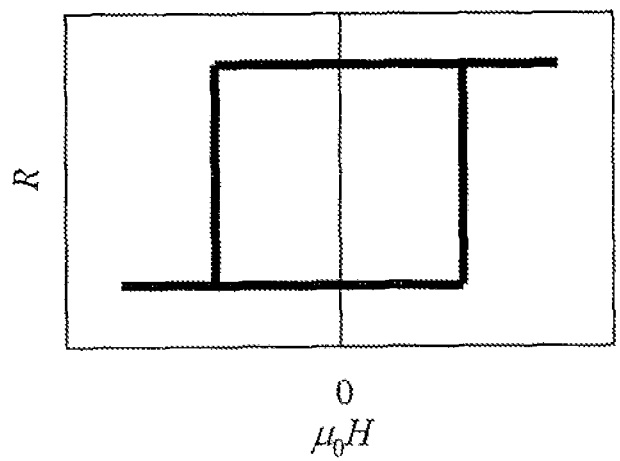
FIG. 4A is a view showing R-H characteristics of the magnetic tunnel junction with perpendicular magnetization without $H_s$.
Figure 4B:
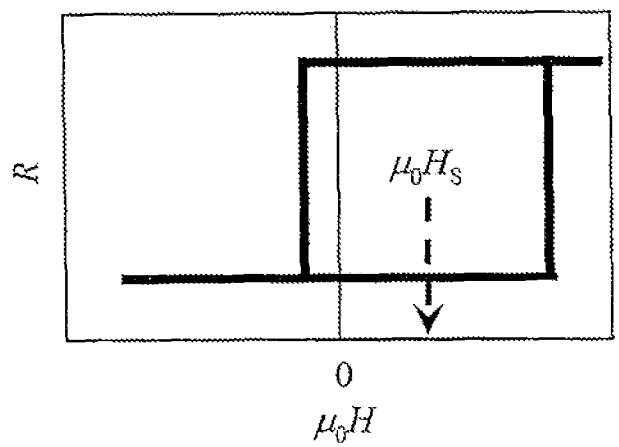
FIG. 4B is a view showing R-H characteristics of the magnetic tunnel junction with perpendicular magnetization with $H_s$.
Figure 5A:
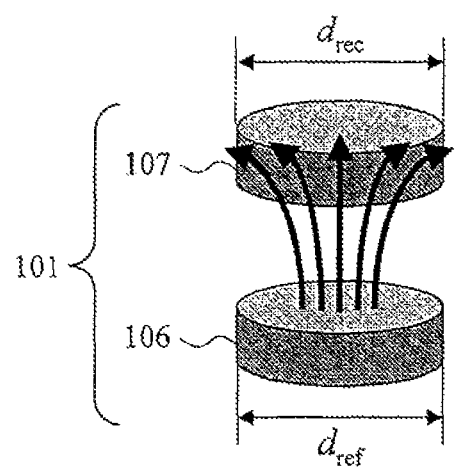
FIG. 5A is a schematic view showing $H_s$ generated in a direction from the reference layer to the recording layer when the recording layer and the reference layer have the same area.
Figure 5B:
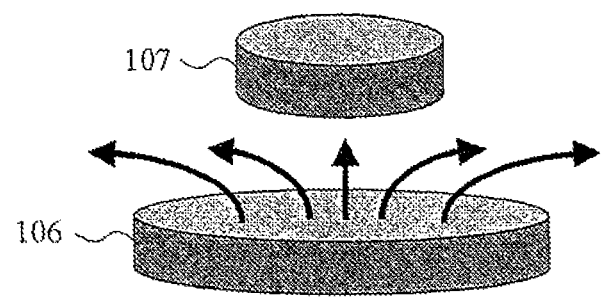
FIG. 5B is a schematic view showing $H_S$ generated in a direction from the reference layer to the recording layer when the recording layer and the reference layer have different areas.
Figure 6:
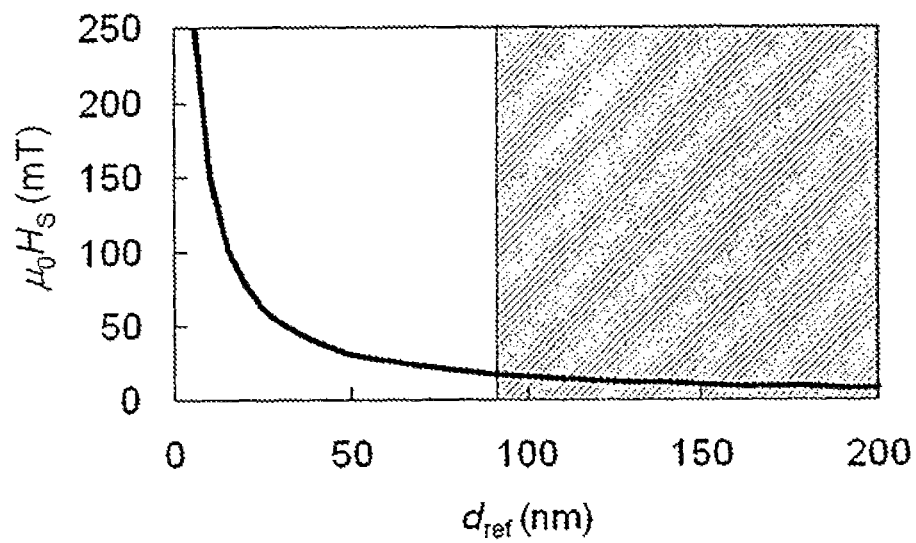
FIG. 6 is a view showing a relation between $d_{ref}$ and $H_s$.
Figure 7:
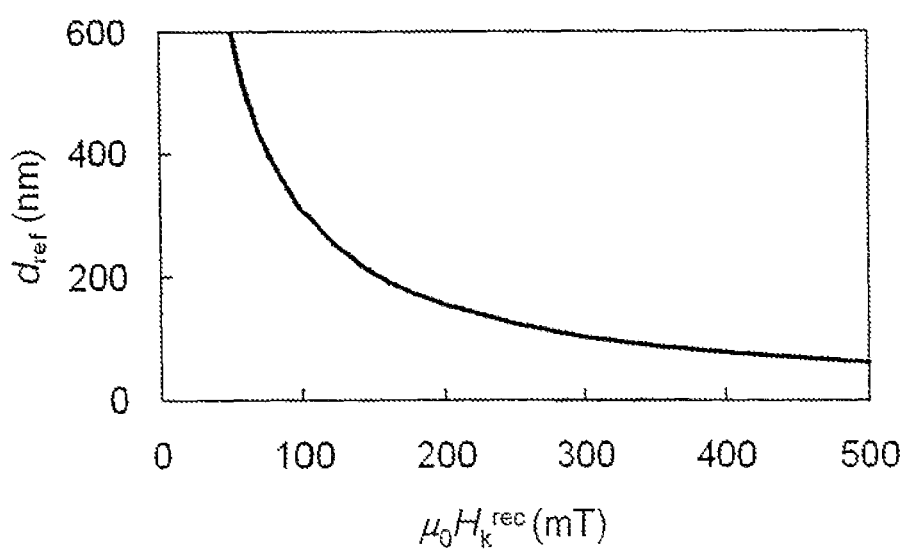
FIG. 7 is a view showing a relation between $H_k^{rec}$ and $d_{ref}$ of the reference layer.
Figure 8:
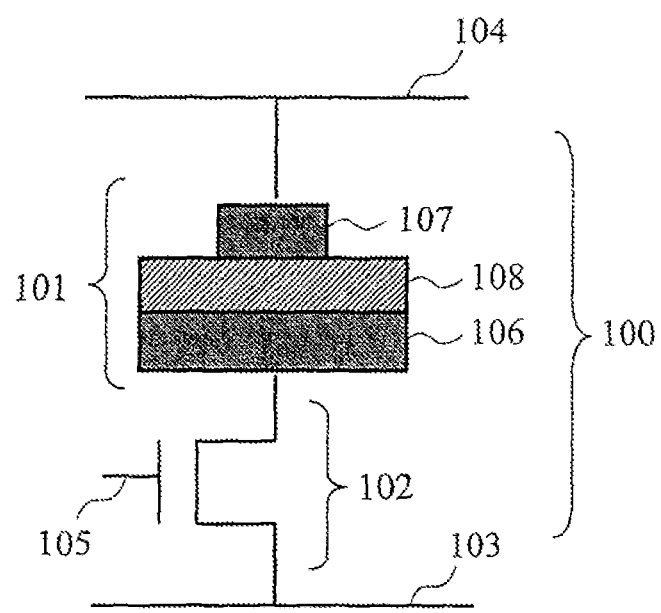
FIG. 8 is a schematic cross-sectional view of a memory cell of an embodiment 1.

FIG. 8 is a schematic cross-sectional view of an MRAM memory cell 100 of the present embodiment. The MRAM memory cell 100 is configured to have a magnetic tunnel junction 101 and a selecting transistor 102 electrically connected in series. The selecting transistor 102 has a source electrode, a drain electrode and a gate electrode, which are electrically connected to a source line 103, to a bit line 104 via the magnetic tunnel junction 101, and to a word line 105, respectively. The magnetic tunnel junction 101 is configured to have a nonmagnetic layer 108 interposed between a first ferromagnetic layer 106 and a second ferromagnetic layer 107.

Figure 9A:
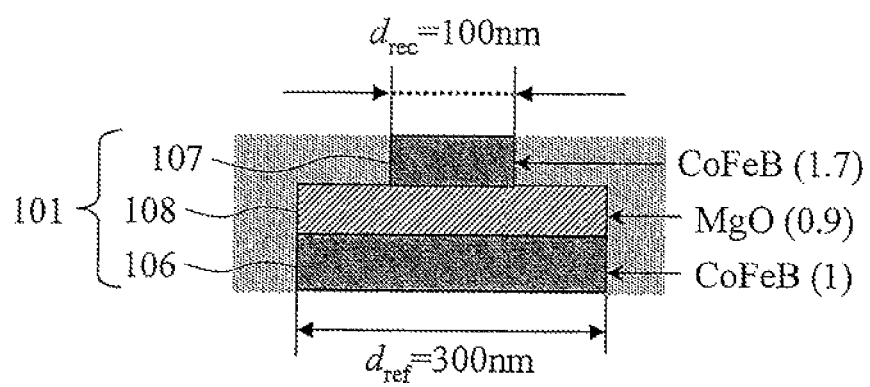
FIG. 9A is a schematic cross-sectional view of a magnetic tunnel junction in the embodiment 1.

In an example shown in FIG. 8, the first ferromagnetic layer 106 is the reference layer, and the second ferromagnetic layer 107 is the recording layer. FIG. 9A shows a material and a film thickness of each layer of the magnetic tunnel junction with perpendicular magnetization in this present embodiment. The unit of numerical figures in parenthesis which indicate the film thickness is nm. As shown in FIG. 9A, the manufactured magnetic tunnel junction 101 has the reference layer and the recording layer made of CoFeB and the nomnagnetic layer 108 made of MgO. This material constitution is based on the technology disclosed in Nature Mater., 9, 721 (2010). Perpendicular magnetization is implemented by interface magnetic anisotropy induced at the interface between CoFeB and MgO.

Figure 9B:
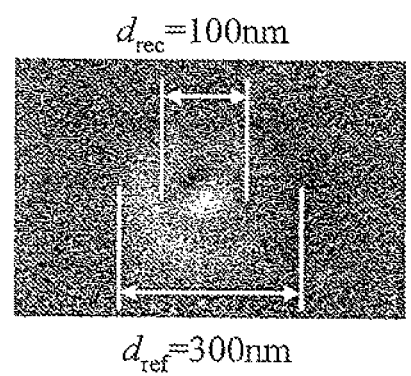
FIG. 9B is an SEM image of the magnetic tunnel junction in the embodiment 1.

A step-like configuration shown in FIG. 9A is manufactured by two lithography steps. A film having a reference layer, a nonmagnetic layer and a recording layer deposited in this order is processed with a lithography apparatus to have the shape of the recording layer patterned thereon. Then, the film is etched to the surface of the barrier layer MgO with an etching apparatus to form the recording layer. The lateral surfaces of the recording layer are coated with an interlayer insulation film. Next, the film is processed with the lithography apparatus to have the shape of the reference layer patterned thereon, and then the barrier layer MgO and the reference layer CoFeB are etched with the etching apparatus. Finally, the lateral surfaces of the barrier layer MgO and the reference layer CoFeB are once again coated with the interlayer insulation film. Through such steps, the magnetic tunnel junction 101 as shown by an SEM (Scanning Electron Microscopy) image of FIG. 9B is manufactured.

The step-like configuration as shown in FIG. 9A can be manufactured according to manufacturing steps other than the foregoing steps. For example, in the foregoing description, the recording layer is patterned and processed first in the two lithography steps. However, the reference layer may be patterned and processed first instead. The magnetic tunnel junction 101 shown in FIG. 9A is manufactured as a circular shape with $d_{rec}$=100 mm and $d_{ref}$=300 nm. In this case, the value of $\mu_0 H_s$ calculated with use of the formula (8) is expected to be about 6 mT. If the magnetic tunnel junction 101 is manufactured to have an elliptical shape or a polygonal shape instead of the circular configuration, the same effects can still be acquired. In that case, the elliptical or polygonal area should only be adjusted so as to be generally equal to the designed area of the circular shape.

Figure 10A:
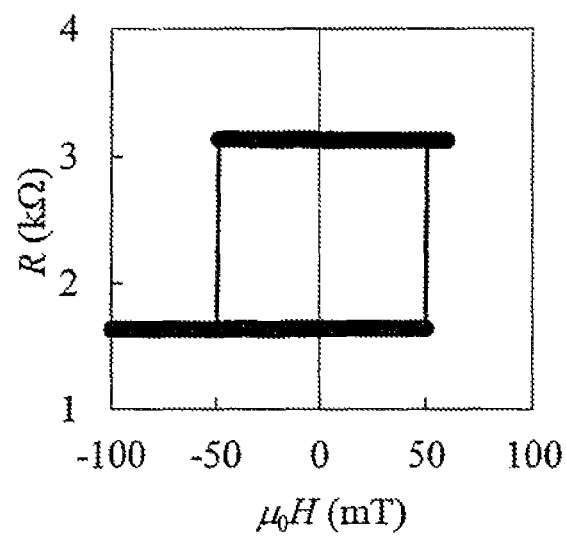
FIG. 10A is a view showing R-H characteristics of the magnetic tunnel junction in the embodiment 1.

FIG. 10A shows a minor loop of R-H characteristics of the thus-manufactured step-like configuration of the magnetic tunnel junction 101. The center of the minor loop in FIG. 10A corresponds approximately to $\mu_0 H$=0. In this case, $H_s$ obtained here is $\mu_0 H_s$=5.3 mT, which is almost the same as 6 mT, a value estimated from the formula (8). The above result indicates that the magnetic tunnel junction 101 having the step-like configuration is effective as a means to correct the imbalance in the thermal stability between the P state and the AP state. More specifically, the present embodiment has an effect of solving the problem of the difference in record retention time of bit information "0" and bit information "1" in the memory cell having the magnetic tunnel junctions with perpendicular magnetization incorporated therein.

Figure 10B:
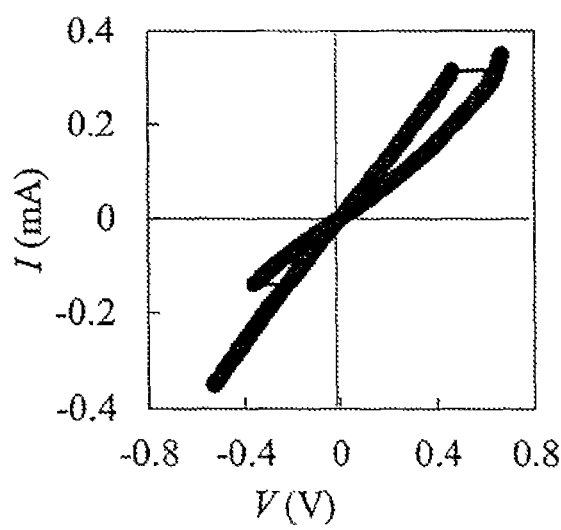
FIG. 10B is a view showing I-V characteristics of the magnetic tunnel junction in the embodiment 1.

FIG. 10B is a view showing I-V characteristics of the magnetic tunnel junction 101 with step-like configuration. As shown in FIG. 10B, spin transfer torque implements current magnetization reversal.

Figure 10C:
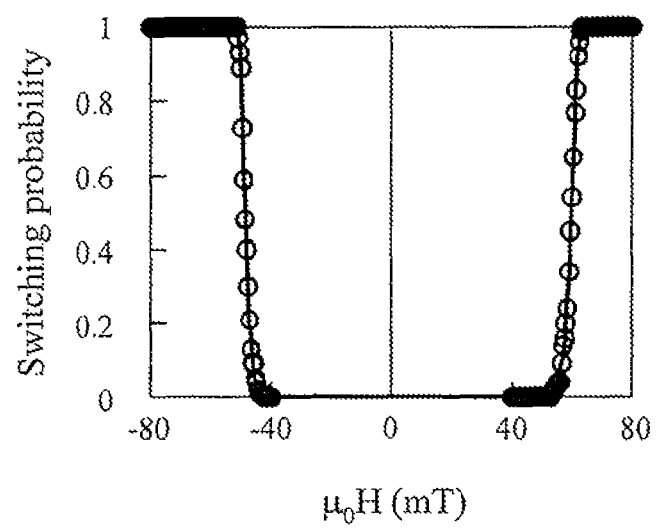
FIG. 10C is a view showing dependence of write probability on an external magnetic field in the magnetic tunnel junction of the embodiment 1.

FIG. 10C shows dependence of write probability on an external magnetic field. The measurement result in FIG. 10C indicates that $E/k_B T$ in the P state is 73 and $E/k_B T$ in the AP state is 70. Since there is no significant difference between the measurement results of $E/k_B T$ in the P state and in the AP state, it can be concluded that the present embodiment has an effect of solving the problem of difference in record retention time of bit information "0" and bit information "1".

Since the present invention is applicable in the case where the magnetization direction of the first ferromagnetic layer 106 and the second ferromagnetic layer 107 is perpendicular, any perpendicular magnetic anisotropy materials may be used for the first ferromagnetic layer 106 and the second ferromagnetic layer 107. Examples of the materials include rare earth/transition metal alloys, (Co, Fe)—Pt alloys with $L1_0$ configuration, and Co/(Pd, Pt) multilayer films. It is also possible to apply a material including at least one kind of 3d transition metals typified by CoFeB as the material of the first ferromagnetic layer 106 and the second ferromagnetic layer 107, and to apply an oxide barrier layer typified by MgO as the material, of the nonmagnetic layer 108.

Embodiment 2

Figure 11:
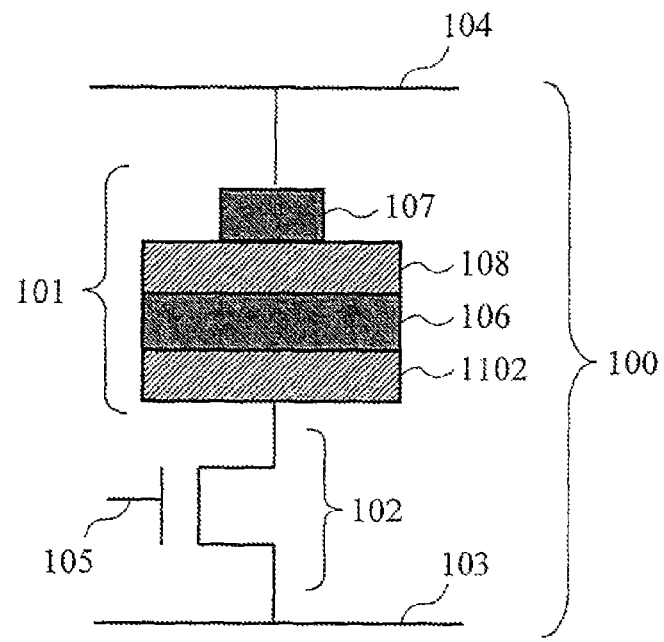
FIG. 11 is a schematic cross-sectional view of a memory cell of an embodiment 2.

FIG. 11 is a schematic cross-sectional view showing a memory cell 100 and a magnetic tunnel junction 101 in an embodiment 2. The magnetic tunnel junction in FIG. 11 is equivalent to the magnetic tunnel junction of the embodiment 1 shown in FIG. 9A with a nonmagnetic layer 1102 added thereto. In another aspect of the present invention, when a material including at least one kind of 3d transition metals typified by CoFeB is applied as the material of the first ferromagnetic layer 106 and the second ferromagnetic layer 107, and an oxide battier layer typified by MgO is applied as the material of the first nonmagnetic layer 108, a second nonmagnetic layer 1102 constituted from an oxide barrier layer made of a material such as MgO, Al$_2$O$_3$ and SiO$_2$ may be manufactured on an interface of the first ferromagnetic layer 106 on the opposite side of the nonmagnetic layer 108 in the magnetic tunnel junction 101.

In an example shown in FIG. 11, the first ferromagnetic layer 106 is the reference layer, and the second ferromagnetic layer 107 is the recording layer. The material and the film thickness of the first ferromagnetic layer 106, the second ferromagnetic layer 107, and the nonmagnetic layer 108 are the same as those in the embodiment 1. As shown in Nature Mater., 9, 721 (2010), the direction of magnetic anisotropy is changed from the direction parallel with the film plane to the direction perpendicular to the film plane by controlling the film thickness of the material including at least one kind of 3d transition metals, such as Co and Fe, controls the film thickness. This change is caused by interfacial anisotropy. It is considered that the interface magnetic anisotropy notably appears at the interface with oxides such as MgO, Al$_2$O$_3$, and SiO$_2$ in particular. Therefore, providing the configuration as shown in FIG. 11 makes it possible to increase the value of $H_k^{ref}$ of the reference layer through the increase in the interfacial anisotropy. In the magnetic tunnel junction 101 manufactured in this way, the value of E/k$_B$T in the AP state exceeds 70.

As shown in the formula (3), $J_{c0}$ is proportional to $H_k^{ref}$. Therefore, if the value of $H_k^{ref}$ of the reference layer is increased, the current disrupts magnetization reversal in the reference layer. As a result, write disturb can be suppressed. For example, the film thickness in the case of using MgO for the second nonmagnetic layer 1102 is set to 0.4 nm. The second nonmagnetic layer 1102 may be made of Pt, Pd, or a material with a large spin orbital interaction, typified by a material including at least one kind of Pt and Pd. When such a material is used, a damping constant α of the reference layer can be increased. As shown in the formula (3), $J_{c0}$ is proportional to α. Therefore, as the value of α becomes larger, magnetization reversal in the reference layer is more obstructed by the current. As a result, write disturb can be suppressed. For example, the film thickness in the case of using Pt for the second nonmagnetic layer 1102 is set to 2 nm.

Figure 12:
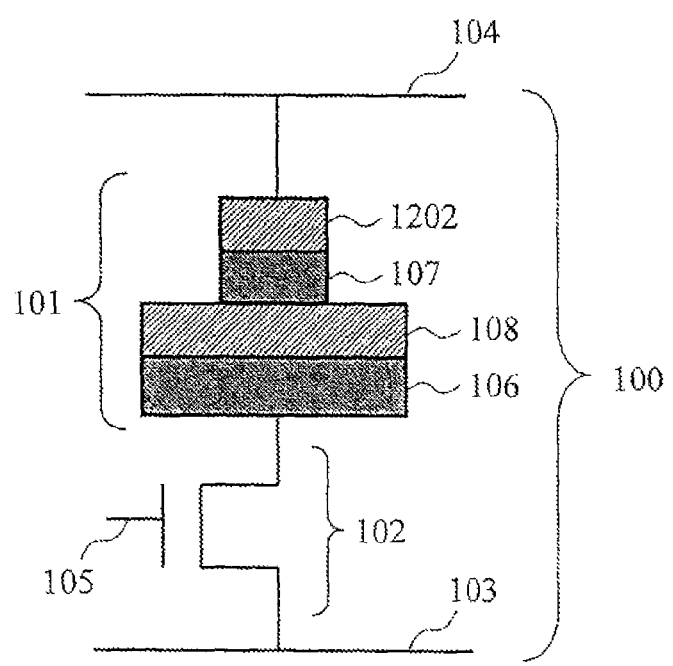
FIG. 12 is a schematic cross-sectional view of the memory cell of the embodiment 2.

As shown in FIG. 12, a third nonmagnetic layer 1202, with an oxide barrier layer made of a material such as MgO, Al$_2$O$_3$, and SiO$_2$ applied thereto, may be manufactured on an interface of the second ferromagnetic layer 107 on the opposite side of the nonmagnetic layer 108. In this case, the value of $H_k^{rec}$ can be increased and record retention time can be lengthened.

Embodiment 3

In another aspect of the present invention, etching for forming the recording layer may be stopped on the surface of the reference layer in the magnetic tunnel junction shown in the embodiment 1.

Figure 13:
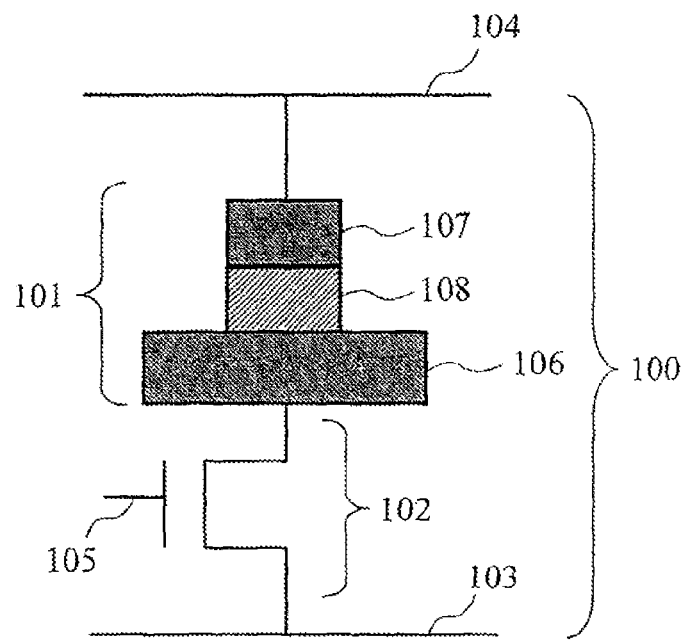
FIG. 13 is a schematic cross-sectional view of a memory cell of an embodiment 3.

FIG. 13 is a schematic cross-sectional view showing a magnetic tunnel junction 101 and a memory cell 100 of this embodiment. In an example shown in FIG. 13, the first ferromagnetic layer 106 is the reference layer, and the second ferromagnetic layer 107 is the recording layer. The magnetic tunnel junction 101 of the present embodiment is manufactured by two lithography steps in the same way as in the case of the magnetic tunnel junction 101 of the embodiment 1. A film made by using CoFeB for the reference layer and the recording layer and MgO for the nonmagnetic layer 108 is processed with a lithography apparatus to have the shape of the recording layer patterned thereon. The film is then etched to the surface of the reference layer CoFeB with an etching apparatus to form the recording layer. Further, the lateral surfaces of the recording layer CoFeB and the barrier layer MgO are coated with an interlayer insulation film. Next, the film is processed with the lithography apparatus to have the shape of the reference layer patterned thereon, and then the reference layer CoFeB is etched with the etching apparatus. Finally, the lateral surfaces of the reference layer CoFeB are once again coated with the interlayer insulation film.

The advantage of the magnetic tunnel junction 101 of the embodiment 3 manufactured in such steps is a large process margin in the first etching. It poses no problems even if etching is stopped in a middle portion of the nonmagnetic layer 108. Accordingly, variations in etched depth, if present, can be absorbed in proportion to the film thickness of the nonmagnetic layer 108. In the magnetic tunnel junction 101 actually manufactured in such a method, the value of E/k$_B$T in the AP state exceeds 70.

Embodiment 4

In another aspect of the present invention, the magnetic tunnel junction may have a tapered structure achieved by inclining the etching direction at the time of forming the first ferromagnetic layer, the nonmagnetic layer, and the second ferromagnetic layer in order to make the reference layer larger in area than the recording layer.

Figure 14:
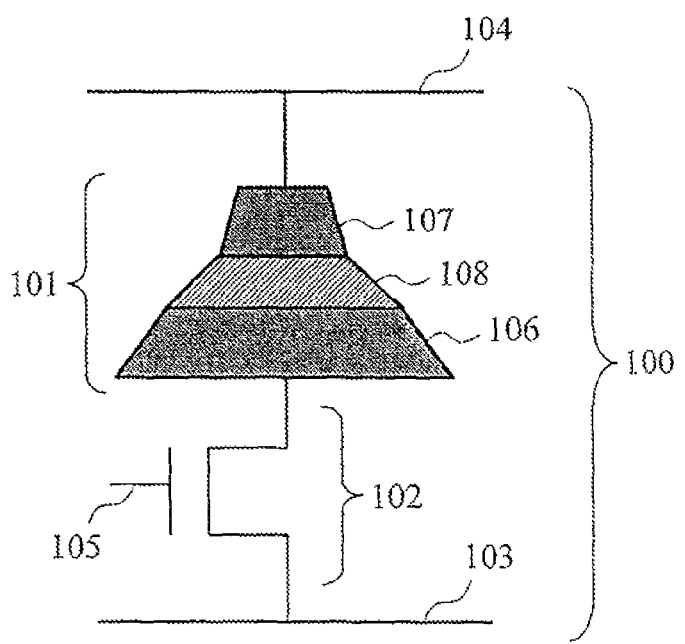
FIG. 14 is a schematic cross-sectional view of a memory cell of an embodiment 4.

FIG. 14 is a schematic cross-sectional view showing a magnetic tunnel junction 101 and a memory cell 100 of this embodiment. In an example shown in FIG. 14, the first ferromagnetic layer 106 is the reference layer, and the second ferromagnetic layer 107 is the recording layer. The reference layer and the recording layer are made of CoFeB, and the nonmagnetic layer 108 is made of MgO. The magnetic tunnel junction 101 of the present embodiment can advantageously be manufactured by one lithography step. An angle in the etching direction varies depending on etching conditions, film thickness of each layer and so forth. In an example shown in FIG. 14, the angle in the etching direction is 30 degrees assuming that the direction perpendicular to the substrate surface is 0 degree. The angle in the etching direction may be adjusted with the design values such as $d_{rec}$ and $d_{ref}$. In the magnetic tunnel junction 101 manufactured in such a method, the value of E/k$_B$T in the AP state exceeds 70.

[Memory Circuit Configuration]

Figure 15:
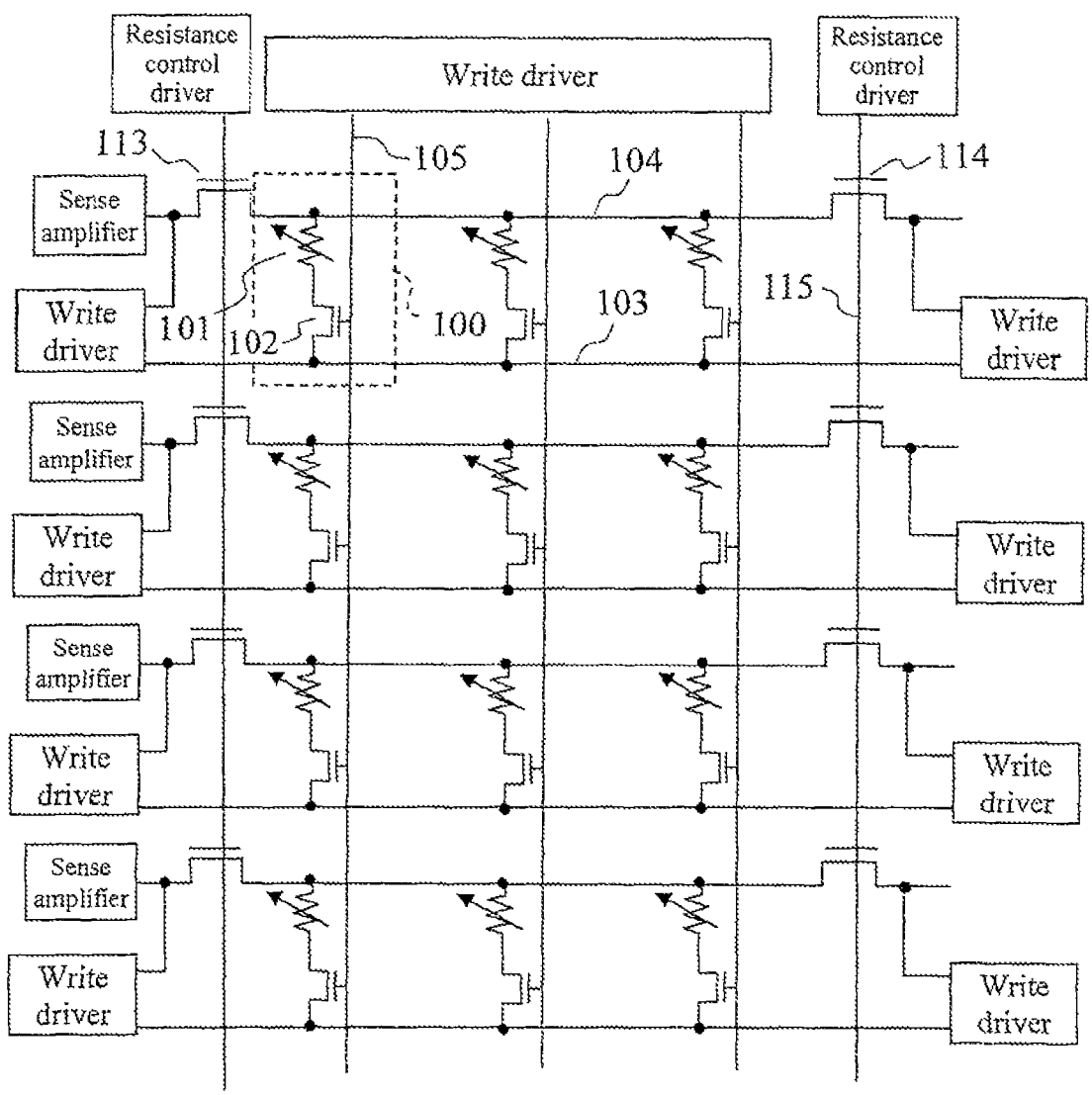
FIG. 15 is a view showing an example of a memory array circuit having a memory cell of the present invention mounted thereon.

FIG. 15 shows a configuration example of a magnetic random access memory according to the present invention. In FIG. 15, there are shown a source line 103, a magnetic tunnel junction 101 of the present invention, a bit line 104, a cell selecting transistor 102, a word line 105, and one magnetic random access memory cell 100.

A plurality of hit lines are placed in parallel with each other, and a plurality of source lines are placed in parallel with each other in a direction parallel to the bit lines. A plurality of word lines are placed in parallel with each other in a direction intersecting the bit lines. The memory cell 100 having a magnetic tunnel junction and a selecting transistor 102 is placed at a portion where the bit line intersects with the word line. Reference numerals 113 and 114 denote resistance change elements (e.g., transistors) for controlling the magnitude of the current passed to the bit lines, and reference numeral 115 denotes a resistance control word line for controlling the conduction state of the resistance change elements 113 and 114. A sense amplifier for amplifying a read signal from the magnetic random access memory cell is connected to the bit line 104. In an example shown in the drawing, one end of the selecting transistor 102 is electrically connected to the source line 103. A recording layer-side of the magnetic tunnel junction 101 is connected to the bit line 104. The selecting transistor 102 is controlled by the word line 105.

Figure 16:
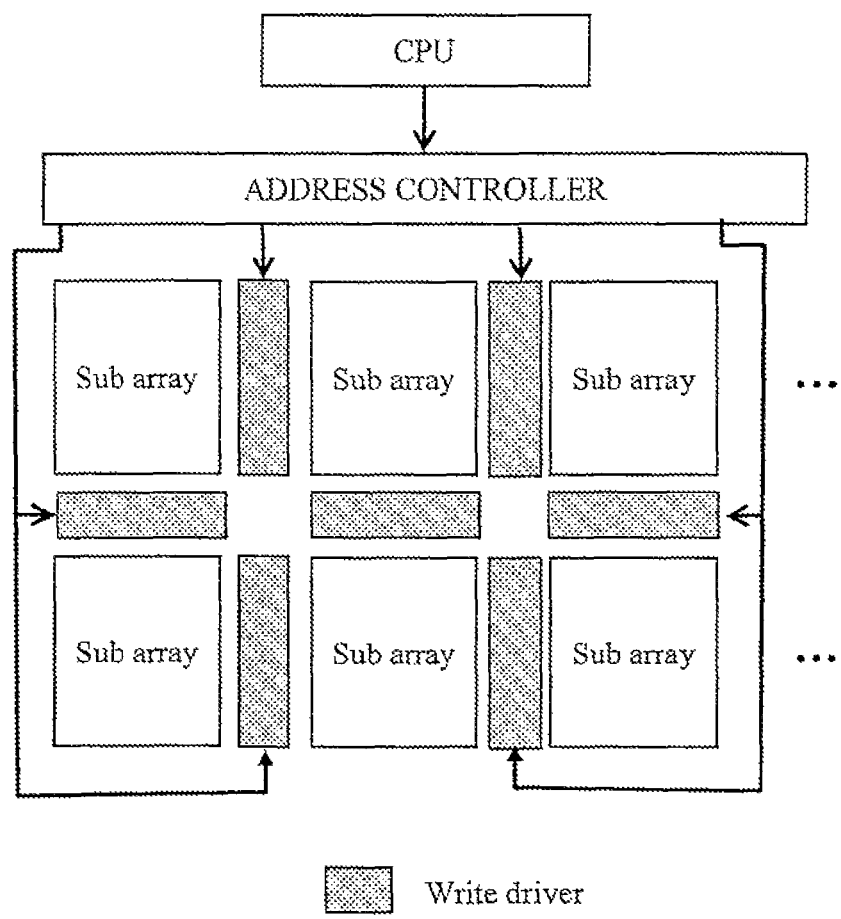
FIG. 16 is a schematic view showing a controller of the memory.

Write operation in the magnetic random access memory of this configuration is as shown in FIG. 16. For example, in the case of conducting write access to the memory tell 100, a CPU first transmits to an address controller a signal for specifying the address of the memory cell 100 to which write access is performed. The address controller then transmits a write enable signal to a write driver connected to the bit line 104 to which a current should be passed, so that the voltage therein is boosted. Next, the voltage of a resistance control driver is controlled so that a specified current is passed to the bit line 104. Depending on a current direction, either a write driver connected to the resistance change element 113 or a write driver connected to the resistance change element 114 is set to a ground potential for adjustment of a potential difference and for control of the current direction. After a lapse of predetermined time, a write enable signal is transmitted to a write driver connected to the word line 105 so that the voltage of the write driver is boosted, and the selecting transistor 102 is turned ON. As a consequence, a current is passed into the magnetic tunnel junction 101 and spin torque magnetization reversal is conducted. After the selecting transistor 102 is ON state for predetermined time, the signal to the writing driver is disconnected and the selecting transistor 102 is turned OFF.

In read operation, the CPU transmits to the address controller a signal for specifying the address of the memory cell 100 to which read access should be made. In response to the signal from the address controller, only the bit line 104 connected to a target memory cell is read and is boosted to a voltage V. An enable signal is transmitted to the word line 105 connected to the magnetic tunnel junction 101. The selecting transistor 102 is thereby turned on and a current is passed thereto. A voltage difference between both ends of the resistance of the magnetic tunnel junction 101 in the desired memory cell 100 is amplified with the sense amplifier. As a result, read operation is conducted.

It should be understood that the present invention is not limited to the embodiments disclosed above and various modified examples are included therein. For example, the foregoing embodiments have been described in detail for easy understanding of the present invention. The present invention, therefore, is not necessarily limited to those including all the configuration members described therein. It should also be understood that a part of the configuration in one embodiment may be replaced with the configuration of other embodiments, and the configuration of one embodiment may be added to the configuration of other embodiments. Moreover, it is possible to delete and replace a part of the configuration of each embodiment and to add other configurations thereto.

DESCRIPTION OF SYMBOLS

100 Memory cell
101 Magnetic tunnel junction.
102 Selecting transistor
103 Source line
104 Bit line
105 Word line
106 First ferromagnetic layer
107 Second ferromagnetic layer
108 Nonmagnetic layer

What is claimed is:
1. A magnetic tunnel junction, comprising:
a reference layer whose magnetization direction is invariable;
a recording layer whose magnetization direction is variable; and
a nonmagnetic layer electrically connected between the reference layer and the recording layer,
wherein
magnetization of the reference layer and the recording layer is perpendicular to a film plane,
the reference layer and the recording layer include a current supply terminal,
the reference layer is larger in area than the recording layer,
a thermal stability factor of the magnetic tunnel junction satisfies the relationship:

$$E_{AP}/k_B T = E_0(1-H_s/H_k^{rec})^2/k_B T \geq 40, \text{ and}$$

a magnitude of a dipole coupling magnetic field generated from the reference layer at a center of the recording layer satisfies the relationship:

$$H_s = M_s t_{ref}(d_{ref}/2)^2/2\mu_0[\{(d_{ref}/2)^2 + t_{bar}^2\}^{3/2}],$$

where $E_{AP}$ represents an energy barrier when magnetization of the reference layer and magnetization of the recording layer are placed in anti-parallel to each other, $k_B$ represents a Boltzmann's constant, T represents absolute temperature, $E_0$ represents an energy barrier without dipole coupling, $H_k^{rec}$ represents an anisotropy magnetic field of the recording layer, $d_{ref}$ represents a diameter of a circle whose area is identical to the area of the reference layer, $t_{ref}$ represents a film thickness of the reference layer, $t_{bar}$ represents a film thickness of the nonmagnetic layer, and $\mu_0$ represents a magnetic permeability under vacuum.

2. The magnetic tunnel junction according to claim 1, wherein
the reference layer, the nonmagnetic layer, and the recording layer have a circular configuration, an elliptical configuration, or a polygonal configuration.

3. The magnetic tunnel junction according to claim 1, wherein
the reference layer is positioned on a substrate, the nonmagnetic layer is positioned on the reference layer, and the recording layer is positioned on the nonmagnetic layer, and
the recording layer is formed by etching a surface of the nonmagnetic layer or a middle portion of the nonmagnetic layer.

4. The magnetic tunnel junction according to claim 1, wherein
the reference layer is positioned on a substrate, the nonmagnetic layer is positioned on the reference layer, and the recording layer is positioned on the nonmagnetic layer, and
the recording layer is formed by etching a surface of the reference layer.

5. The magnetic tunnel junction according to claim 1, wherein
the reference layer is positioned on a substrate, the nonmagnetic layer is positioned on the reference layer, and the recording layer is positioned on the nonmagnetic layer,
the magnetic tunnel junction has a tapered structure.

6. The magnetic tunnel junction according to claim 1, wherein
a ferromagnetic layer constituting at least one of the reference layer and the recording layer is made of a ferromagnetic material including at least one kind of 3d transition metals.

7. The magnetic tunnel junction according to claim 1, wherein the nonmagnetic layer is an oxide.

8. The magnetic tunnel junction according to claim 1, wherein
at least one of the reference layer and the recording layer is a ferromagnetic layer including at least either Co or Fe and having a film thickness of 3 nm or less, and
the nonmagnetic layer is a magnesium oxide.

9. The magnetic tunnel junction according to claim 1, further comprising a nonmagnetic layer made of an oxide provided on an interface of the reference layer on an opposite side of the nonmagnetic layer.

10. The magnetic tunnel junction according to claim 1, further comprising a nonmagnetic layer made of Pt, Pd, or a material including at least one kind of Pt and Pd provided on an interface of the reference layer on an opposite side of the nonmagnetic layer.

11. The magnetic tunnel junction according to claim 1, further comprising a nonmagnetic layer made of an oxide provided on an interface of the recording layer on an opposite side of the nonmagnetic layer.

12. A magnetic random access memory, comprising:
a plurality of bit lines placed in parallel with each other;
a plurality of source lines placed in parallel with each other in a direction parallel to the bit lines;
a plurality of word lines placed in parallel with each other in a direction intersecting the bit lines; and
magnetic tunnel junctions according to any one of claims 1, and 2 to 11 placed at portions where the bit lines intersect with the word lines, wherein
the bit lines are electrically connected to first ends of the magnetic tunnel junctions,
second ends of the magnetic tunnel junctions are electrically connected to a drain electrode of a selecting transistor,
the source lines are electrically connected to a source electrode of the selecting transistor, and
the word lines are electrically connected to a gate electrode of the selecting transistor;
the magnetic random access memory further including a mechanism for applying current in a direction perpendicular to the film planes of the magnetic tunnel junctions.

* * * * *